(12) United States Patent
David

(10) Patent No.: US 10,680,630 B1
(45) Date of Patent: Jun. 9, 2020

(54) SYSTEM AND METHOD TO CANCEL SKEW MISMATCH IN ADCS

(71) Applicant: STMicroelectronics S.A., Montrouge (FR)

(72) Inventor: Olivier David, Chambery (FR)

(73) Assignee: STMICROELCTRONICS S.A., Montrouge (FR)

( * ) Notice: Subject to any disclaimer, the term of this patent is extended or adjusted under 35 U.S.C. 154(b) by 0 days.

(21) Appl. No.: 16/439,038

(22) Filed: Jun. 12, 2019

(51) Int. Cl.
*H03M 1/06* (2006.01)
*H03M 1/12* (2006.01)
*H03M 1/08* (2006.01)

(52) U.S. Cl.
CPC ....... *H03M 1/0607* (2013.01); *H03M 1/0624* (2013.01); *H03M 1/0836* (2013.01); *H03M 1/1215* (2013.01)

(58) Field of Classification Search
CPC ............. H03M 1/0607; H03M 1/0624; H03M 1/0836; H03M 1/1215
USPC .......................................... 341/118, 120, 155
See application file for complete search history.

(56) References Cited

U.S. PATENT DOCUMENTS

| | | | |
|---|---|---|---|
| 7,233,270 B2 | 6/2007 | Lin | |
| 7,236,117 B1 | 6/2007 | Varma et al. | |
| 7,277,040 B2 | 10/2007 | Mazhar | |
| 7,453,389 B1 | 11/2008 | Vu et al. | |
| 7,808,408 B2 | 10/2010 | Madisetti et al. | |
| 8,164,496 B2 | 4/2012 | Velazquez | |
| 8,558,725 B2* | 10/2013 | Kidambi | H03M 1/1052 341/118 |
| 9,041,570 B2* | 5/2015 | Noguchi | H03M 1/005 341/118 |
| 9,553,600 B1 | 1/2017 | Lacroix et al. | |
| 9,608,652 B2 | 3/2017 | Lee et al. | |

OTHER PUBLICATIONS

Manganaro, Gabriele et al., "Interleaving ADCs: Unraveling the Mysteries," analog.com/analogidalogue, 49-07, Jul. 2015, 5 pages.
Rouat, E., et al., "A 1.62GS/s Time-Interleaved SAR ADC with fully digital background mismatch calibration achieving interleaving spurs below 70dBFS," ResearchGate, Conference Paper in Digest Technical Papers—IEEE International Solid-State Circuits Conference, Feb. 2014, 6 pages.

* cited by examiner

*Primary Examiner* — Khai M Nguyen
(74) *Attorney, Agent, or Firm* — Slater Matsil, LLP

(57) ABSTRACT

An interleaved analog to digital converter ("ADC") includes a first ADC having an input for sampling an analog signal during a first time period, an output for providing a digital signal, and a power supply terminal for receiving a first power supply voltage, a second ADC having an input for sampling the analog signal during a second time period, an output for providing a digital signal, and a power supply terminal for receiving a second power supply voltage, a first skew estimator for estimating a skew value of the first ADC, a second skew estimator for estimating a skew value of the second ADC, and a comparator for comparing the skew values, adjusting the first power supply voltage in response to a first output value of the comparator, and adjusting the second power supply voltage in response to a second output value of the comparator.

20 Claims, 11 Drawing Sheets

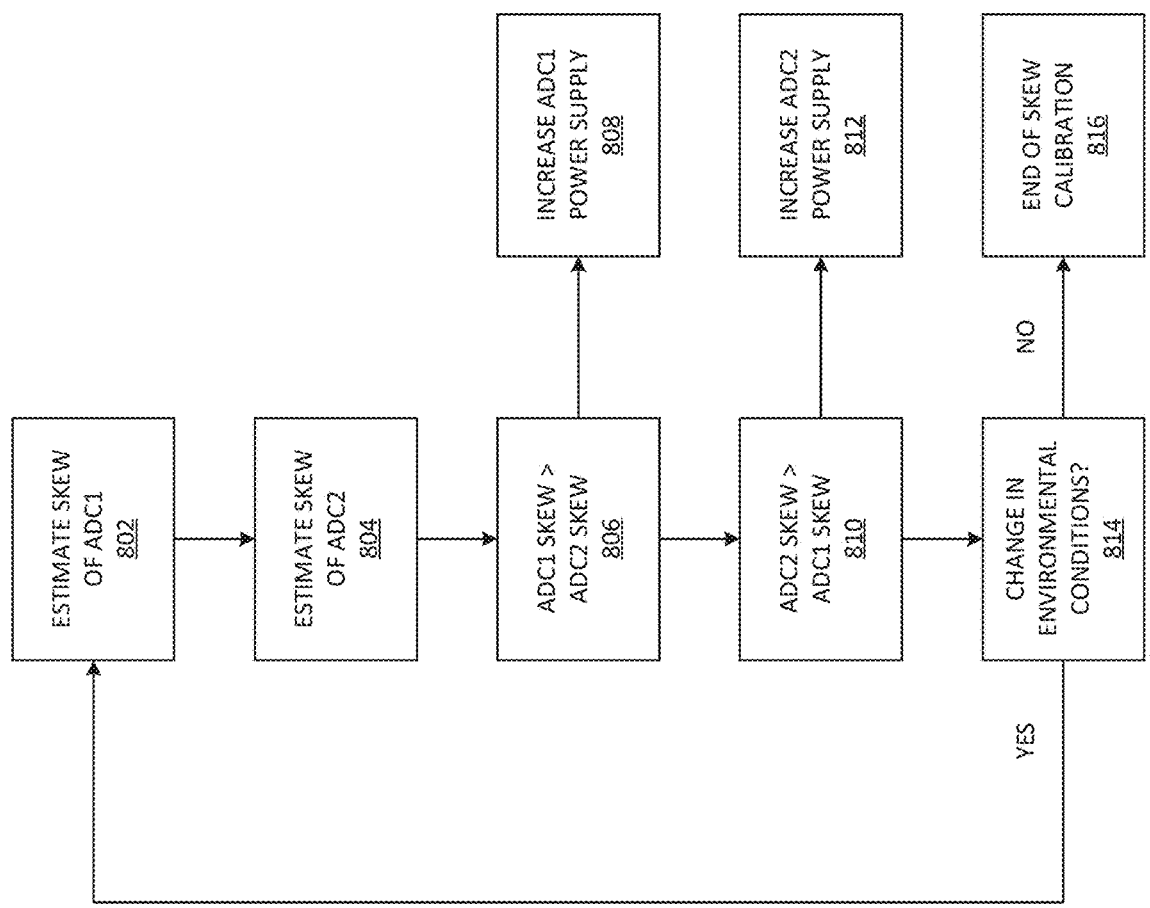

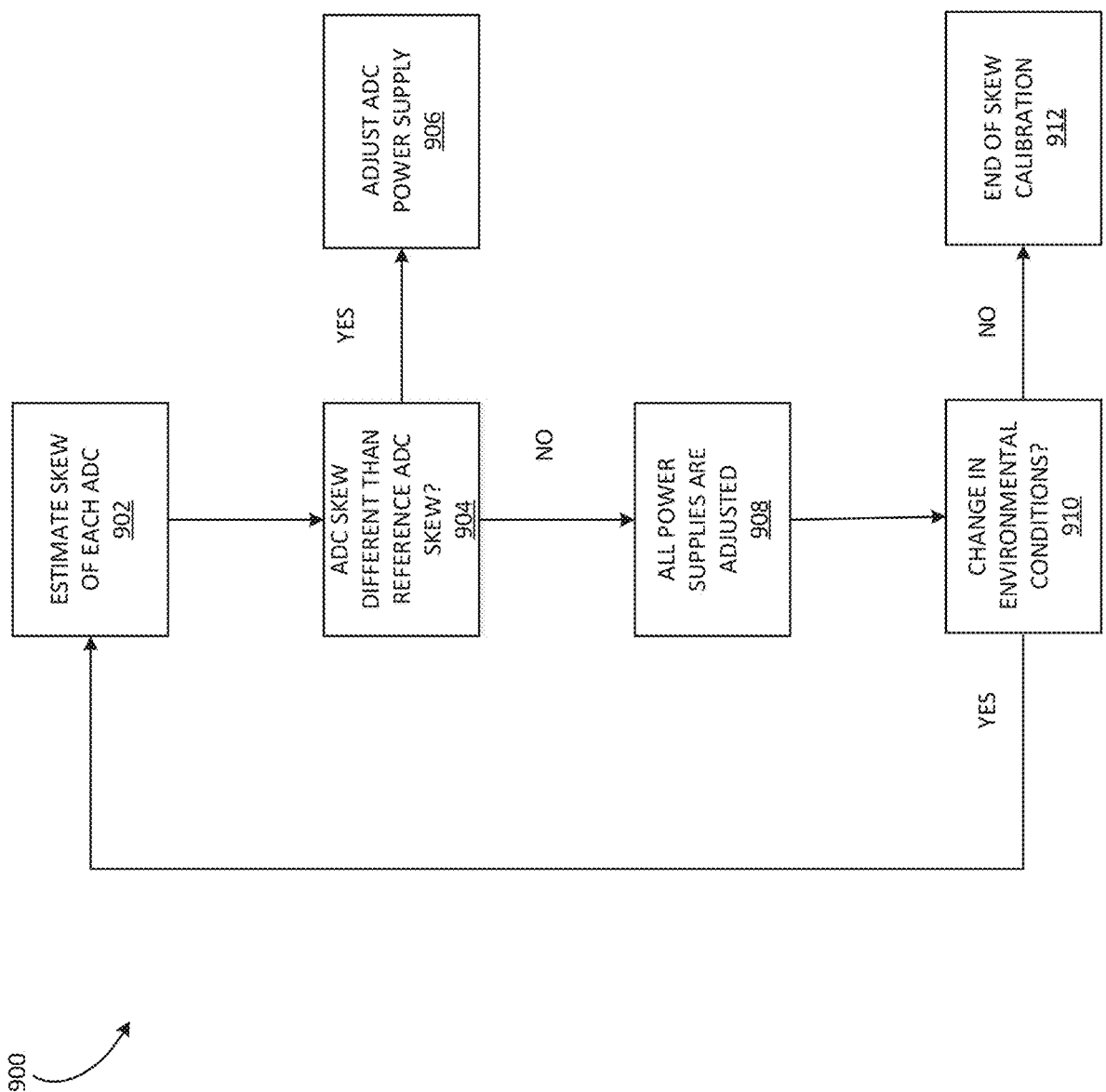

SYSTEM AND METHOD TO CANCEL SKEW MISMATCH IN ADCS

TECHNICAL FIELD

The present invention relates generally to a system and method to cancel skew mismatch in analog to digital converters (ADCs).

BACKGROUND

Time interleaving is a technique that allows the use of multiple ADCs to process an analog input signal into a digital output signal at a faster rate than the operating sample rate of each individual data converter. Time interleaving comprises time multiplexing a parallel array of M identical ADCs, as shown in FIG. 1, to achieve a higher net sample rate 102 ($f_s$ with sampling period $T_s = 1/f_s$) even though each ADC in the array is actually sampling (and converting) at the lower rate of $f_s/M$. So, for example, a 10-bit/400 MSPS ADC can be achieved by interleaving four 10-bit/100 MSPS (Mega Samples Per Second) ADCs.

FIG. 1 is an interleaved ADC 100 including a plurality of ADCs, including $ADC_1$, $ADC_2$, ... $ADC_M$. ADC 100 can include any number of ADCs. The inputs of the ADCs are coupled together for selectively receiving an input voltage $V_{IN}$ by analog switching front end circuitry 104. The outputs of the ADCs are correspondingly selectively coupled together by digital output multiplexer circuitry 106 for generating a composite output digital signal Dour representative of the input analog signal $V_{IN}$. Interleaved ADC 100 has an effective sampling rate 102 of $f_s$, whereas each individual ADC has a sampling rate of $f_s/M$.

In FIG. 1 an analog input $V_{IN}(t)$ is sampled by the "M" ADCs and results in a combined digital output data series $D_{OUT}$. $ADC_1$ samples $V_{IN}(t_o)$ first and begins converting it into an n-bit digital representation. $T_s$ seconds later, $ADC_2$ samples $V_{IN}(t_o + T_s)$ and begins converting it into an n-bit digital representation. Then, Ts seconds later, $ADC_3$ will sample $V_{IN}(t_o + 2\ T_s)$ and so on. After $ADC_M$ has sampled $V_{IN}(t_o + (M-1) \times T_s)$, the next sampling cycle starts over with $ADC_1$ sampling $V_{IN}(t_o + M \times T_s)$.

As the n-bit outputs of the ADCs become sequentially available in the same order as described for the sampling operation, these digital n-bit words are collected by the de-multiplexer shown on the right hand side of FIG. 1. Here the recombined data out sequence $D_{OUT}(t_o + L)$, $D_{OUT}(t_o + L + T_s)$, $D_{OUT}(t_o + L + 2\ T_s)$, ... is generated. "L" stands for the fixed conversion time of each individual ADC and this recombined data sequence is an n-bit data series with sample rate $f_s$. So, while the individual ADCs, often referred to as the "channels," are n-bit ADCs sampling at $f_s/M$, the interleaved ADC 100 is equivalent to a single n-bit ADC sampling at $f_s$. The input analog signal $V_{IN}$ is separately processed by the ADCs in the interleaved ADC 100 and then reassembled at the output to form the high data rate representation $D_{OUT}$ of the input $V_{IN}$.

FIG. 2 shows an example of a clocking scheme with individual clock signals for the case of M=4. The sample rate of each individual ADC in the interleaved ADC is $f_s/M$, and the resulting sample rate 102 of the time interleaved ADC is $f_s$.

While the sampling rate of the interleaved ADC can be increased relative to the sampling rate of an individual ADC in the interleaved ADC as shown, the digital output signal accuracy however can be degraded by relative differences in performance between the individual ADCs. For example, relative differences in offsets, gain, and skew (sampling time skew occurs when some of the channels sample earlier or later than at the designated time interval) between the individual ADCs can all degrade the accuracy of the overall reassembled digital output signal of the interleaved ADC.

SUMMARY

According to an embodiment, an interleaved analog to digital converter ("ADC") system comprises a first ADC having an input configured for sampling an analog signal during a first time period, an output configured for providing a digital signal representative of the analog signal during the first time period, and a power supply terminal configured for receiving a first power supply voltage; a second ADC having an input configured for sampling the analog signal during a second time period different than the first time period, an output configured for providing a digital signal representative of the analog signal during the second time period, and a power supply terminal configured for receiving a second power supply voltage; a first skew estimator configured for estimating a skew value of the first ADC; a second skew estimator configured for estimating a skew value of the second ADC; and a comparator circuit configured for comparing the skew value of the first ADC to the skew value of the second ADC, adjusting the first power supply voltage in response to a first output value of the comparator circuit, and adjusting the second power supply voltage in response to a second output value of the comparator circuit.

According to another embodiment, an interleaved analog to digital converter ("ADC") system comprises a plurality of ADCs having an input configured for sampling an analog signal during a dedicated time period, an output configured for providing a digital signal representative of the analog signal during the dedicated time period, and a power supply terminal configured for receiving a power supply voltage; a plurality of skew estimators configured for estimating a skew value of each of the plurality of ADCs; and a comparator circuit configured for comparing at least two of the skew values of the plurality of ADCs and adjusting the power supply voltage of at least one of the ADCs in response to an output signal of the comparator circuit.

According to another embodiment, a method of operating an interleaved analog to digital converter ("ADC") system comprises estimating a skew value of a first ADC in the ADC system, wherein the first ADC converts an analog input signal to a digital output signal during a first time period; estimating a skew value of a second ADC in the ADC system, wherein the second ADC converts the analog input signal to a digital output signal during a second time period different than the first time period; comparing the skew values of the first ADC and the second ADC; generating a comparison signal after comparing the skew values; adjusting a power supply voltage of the first ADC in response to a first value of the comparison signal; and adjusting a power supply voltage of the second ADC in response to a second value of the comparison signal.

BRIEF DESCRIPTION OF THE DRAWINGS

FIG. 8 is a flow chart of an embodiment method for an interleaved ADC system including two interleaved ADCs;

FIG. 9 is a flow chart of an embodiment method for an interleaved ADC system including a plurality of interleaved ADCs.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Embodiment methods and circuits estimate the relative skew between individual ADCs in an interleaved ADC and adjust the power supply voltages associated with the individual ADCs in accordance with the relative skew estimates order to balance the relative skews. For example, in an interleaved ADC including two ADCs, if the skew of the first ADC is greater than the skew of the second ADC the power supply voltage of the first ADC is increased. Alternatively, if the skew of the second ADC is greater than the skew of the first ADC the power supply voltage of the second ADC is increased.

Figure 3:
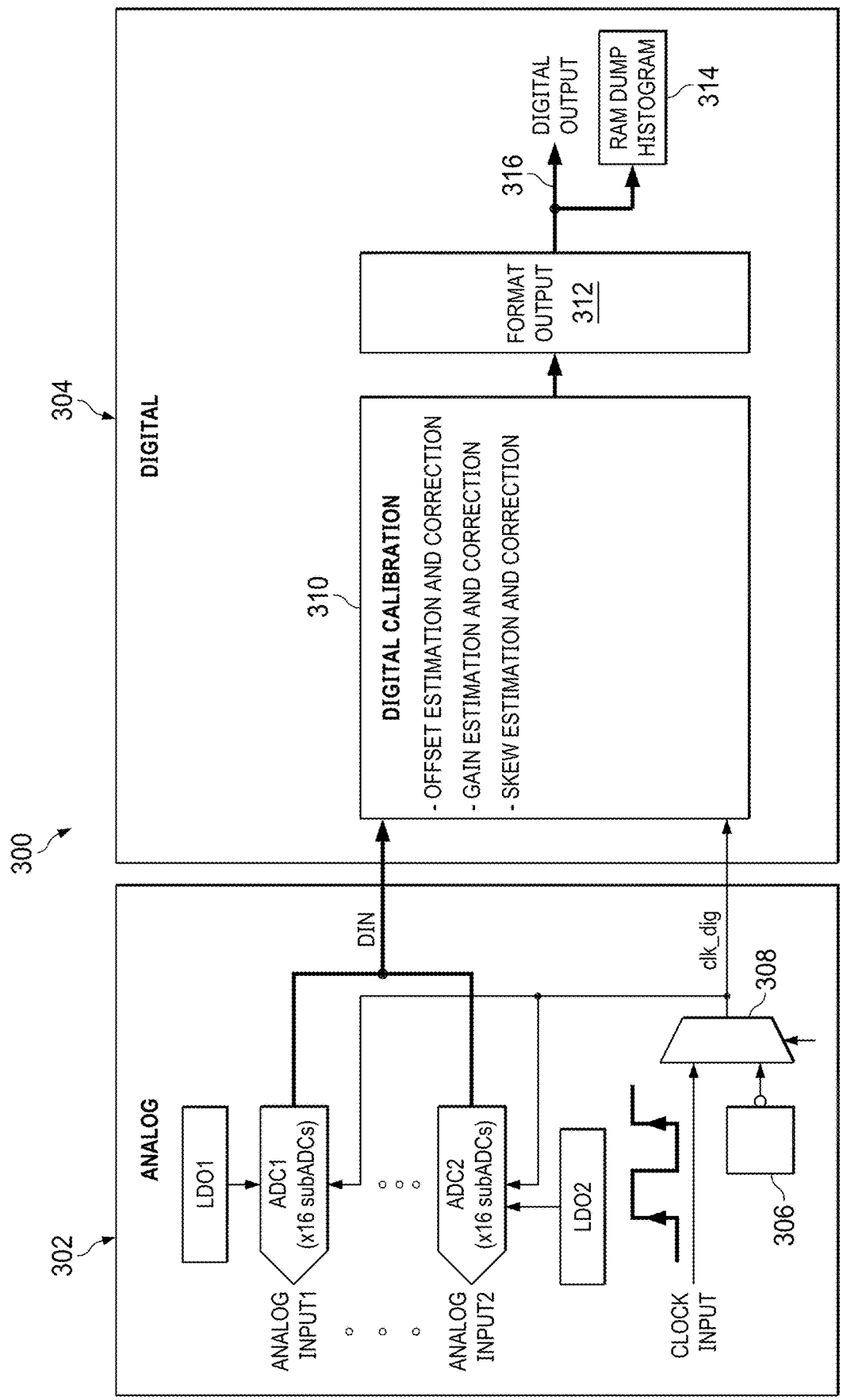
FIG. 3 is a schematic diagram of an exemplary interleaved ADC system including digital calibration circuitry.

FIG. 3 is a schematic diagram of an exemplary interleaved ADC system 300 including digital calibration circuitry. Interleaved ADC includes an analog section 302 including a plurality of individual converter ADCs including $ADC_1$ and $ADC_2$. Converter $ADC_1$ has an input for receiving a first analog input signal and an output for providing a first digital output signal. Converter $ADC_2$ has an input for receiving a second analog input signal and an output for providing a second digital output signal. The digital output signals are combined to provide the composite digital output signal $D_{IN}$. The power supply voltage for $ADC_1$ is provided by low dropout (LDO) voltage regulator LDO1 and the power supply voltage for $ADC_2$ is provided by low dropout voltage regulator LDO2. The power supply voltages for $ADC_1$ and $ADC_2$ are not adjusted in interleaved ADC system 300. Converters $ADC_1$ and $ADC_2$ receive a clock signal $CLK_{DIG}$ that is a non-inverted clock signal or an inverted clock signal 306 from multiplexer 308. Not shown in the analog section 302 of FIG. 3 is the analog switching front end circuitry and the digital output multiplexer circuitry, which have been omitted for clarity.

Figure 1:
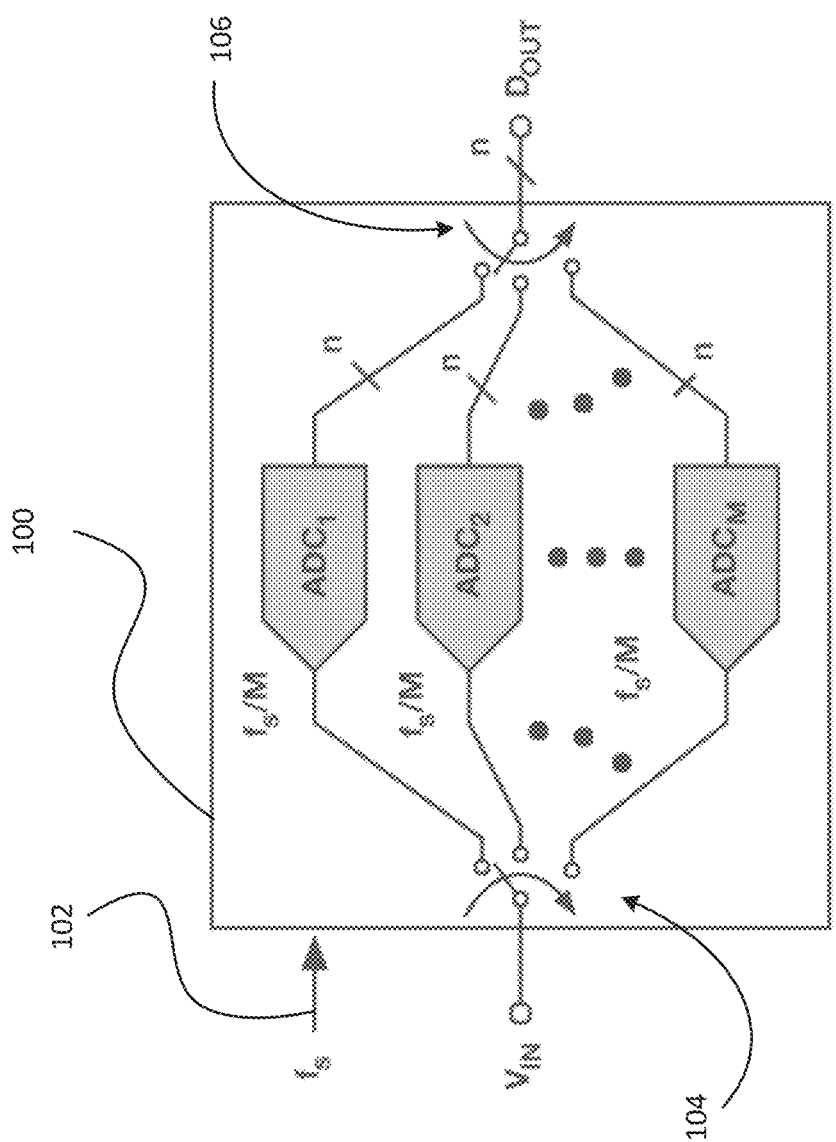
FIG. 1 is a schematic diagram of an exemplary interleaved ADC system.
Figure 2:
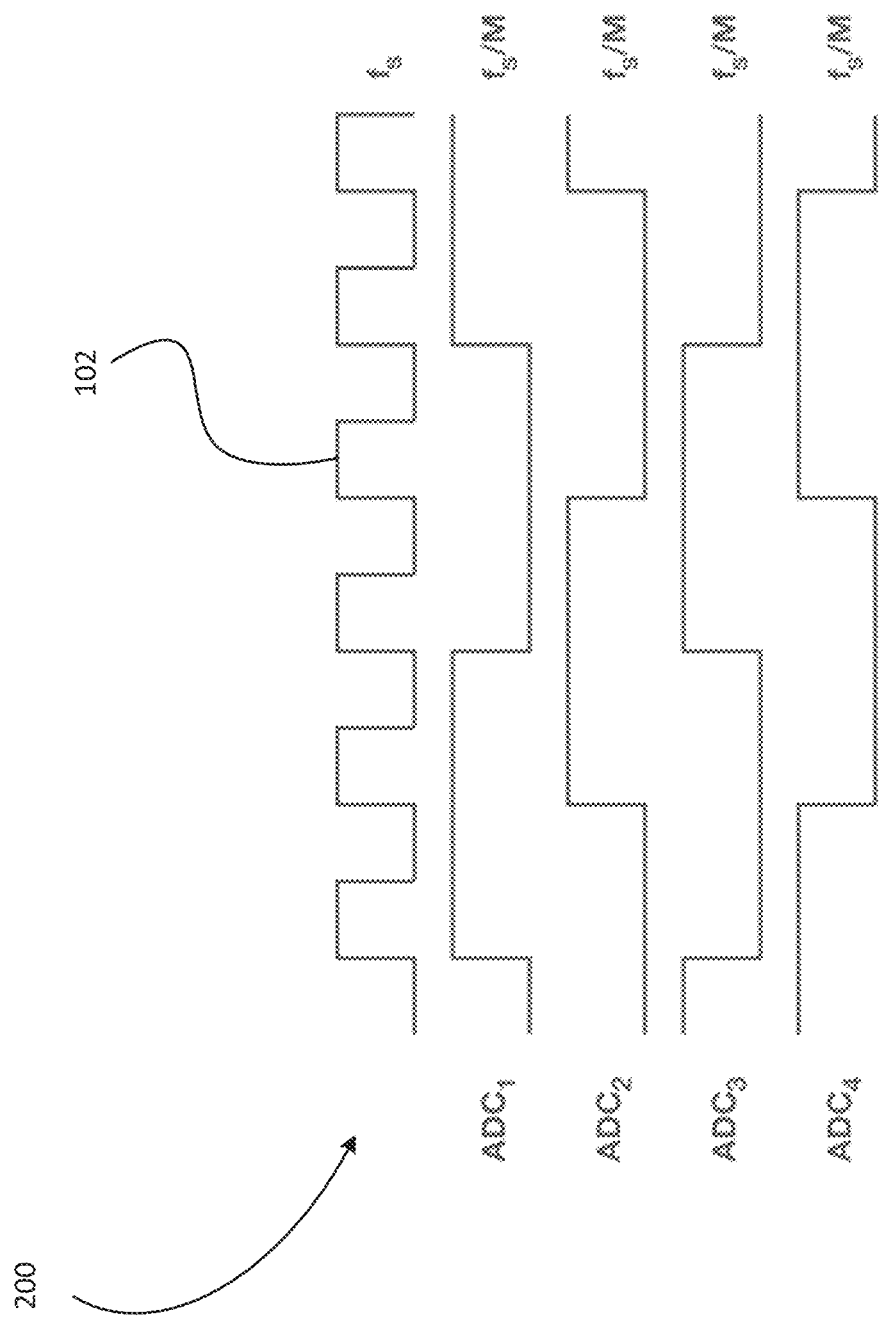
FIG. 2 is a timing diagram for the exemplary interleaved ADC system of FIG. 1.

Each converter $ADC_1$ and $ADC_2$ can, in turn, comprise one or more sub-ADCs arranged in parallel similar to the multiple interleaved ADC system shown in FIG. 1.

Interleaved ADC 300 also includes a digital section 304 including a digital calibration circuitry 310, a formatting block 312 for providing the final digital output signal at digital output 316, and a storage block 314 for providing analytical data regarding the digital output signal. The digital calibration block can include digital estimation and correction circuitry for each individual ADC in the interleaved ADC. For example, digital calibration circuitry 310 can include offset estimation and correction, gain estimation and correction, and skew estimation and correction. Numerous digital estimation and correction methods are known in the art and are not described in further detail. Skew estimation circuits can be implemented in software, in digital circuits, or in analog circuits, or in combinations of these implementations.

Figure 4:
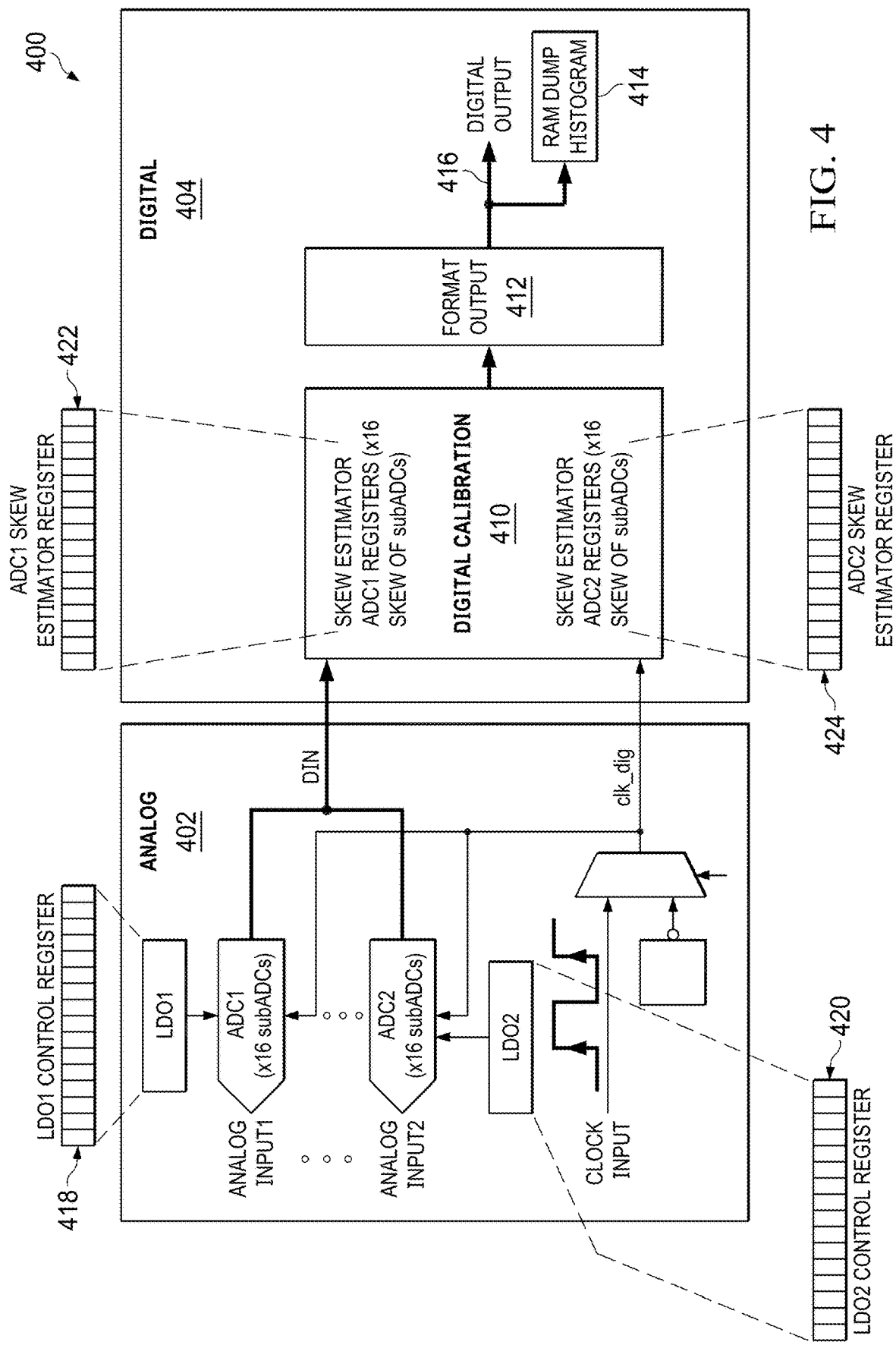
FIG. 4 is a schematic diagram of an interleaved ADC system including digital calibration circuitry according to an embodiment.
Figure 5:
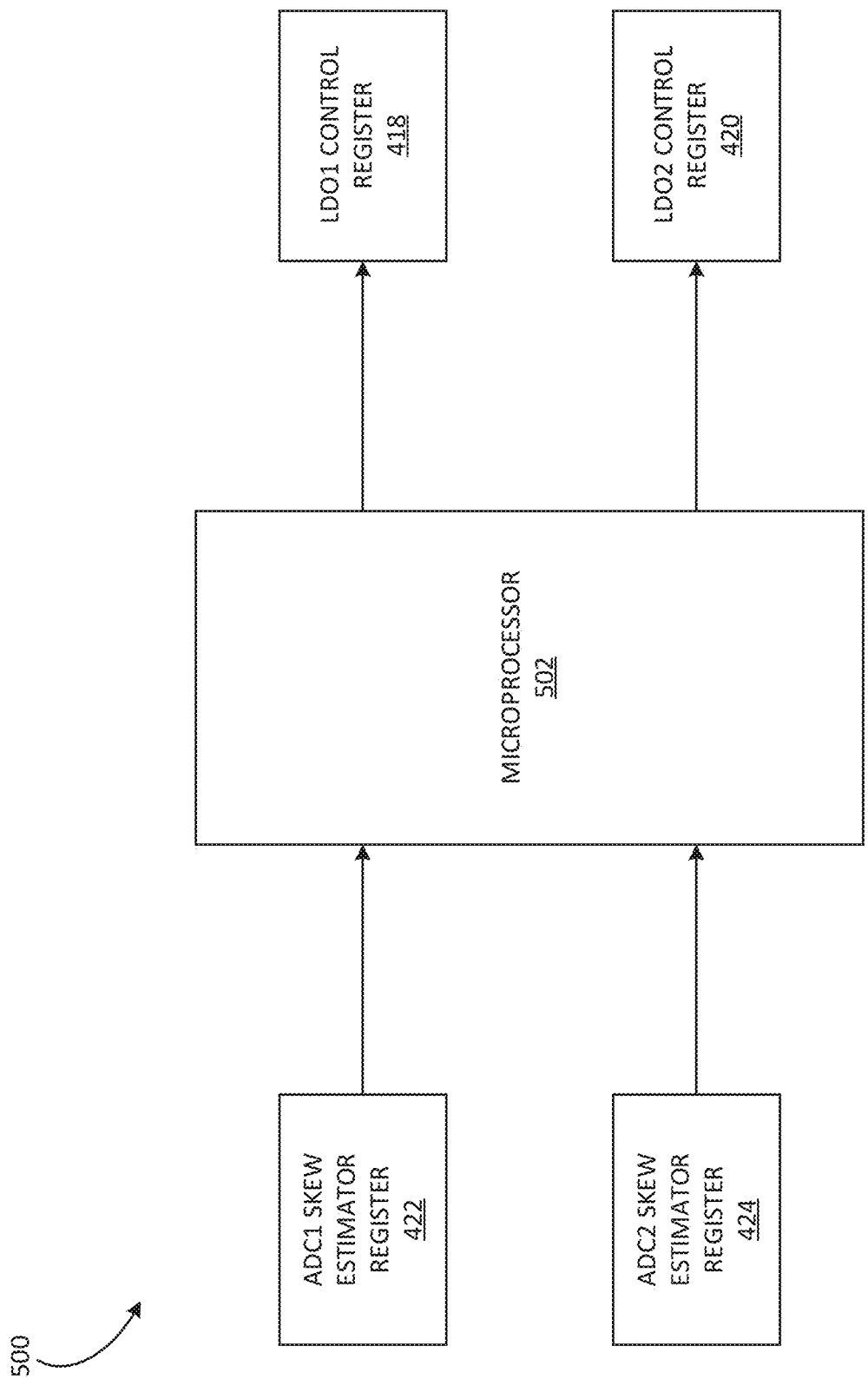
FIG. 5 is a schematic diagram of digital signal processing circuitry associated with the interleaved ADC system of FIG. 4.

FIGS. 4 and 5 describe further features for adjusting the skew of the individual ADCs (and/or sub-ADCs) in an interleaved ADC system by adjusting the power supply voltages of the individual ADCs (and/or sub-ADCs). FIG. 4 includes a mechanism for adjusting the voltage of the power supplies by adjusting power supply registers for supplying the power supply voltages, which is not possible in the circuit of FIG. 3, as well as skew estimation registers for estimating the skew of each of the individual ADCs (and/or sub-ADCs). The digital calibration circuitry shown in FIG. 4 includes at least the skew estimator circuits, but can, in certain embodiments, also include some or all of the digital calibration features shown in FIG. 3. While there are certain similarities between aspects of FIG. 3 and FIG. 4, different identification numerals are used to indicate the adjustable power supply skew balancing functionality provided by the circuits shown in FIGS. 4 and 5. FIG. 5 shows a digital processing circuit including a microprocessor for linking the skew estimation registers with the power supply control registers of FIG. 4 to provide the skew balancing function according to embodiments.

FIG. 4 is thus a schematic diagram of an interleaved ADC system 400 including digital calibration circuitry according to an embodiment, including an analog section 402 and a digital section 404. The analog section 402 includes a plurality of individual ADCs, including $ADC_1$ and $ADC_2$. Not shown in the analog section 402 of FIG. 4 is the analog switching front end circuitry and the digital output multiplexer circuitry, which have been omitted for clarity.

The digital section 404 includes a digital calibration circuitry 410, a formatting block 412 for providing the final digital output signal 416, and a storage block 414.

In an embodiment, analog section 402 includes an LDO1 control register 418 for adjusting the power supply voltage of $ADC_1$, which can include a plurality of sub-registers for adjusting the power supply voltage of each sub-ADC associated with converter $ADC_1$. In an embodiment, analog section 402 also includes an LDO2 control register 420 for controlling the skew of $ADC_2$, which can also include a plurality of sub-registers for adjusting the power supply voltage of each sub-ADC associated with converter $ADC_2$.

In an embodiment, digital calibration circuitry 410 includes a skew estimator register 422 for estimating the skew of $ADC_1$, which can include a plurality of sub-registers for estimating the skew of each sub-ADC associated with converter $ADC_1$. In an embodiment, digital calibration circuitry 410 also includes a skew estimator register 424 for estimating the skew of $ADC_2$, which can also include a plurality of sub-registers for estimating the skew of each sub-ADC associated with converter $ADC_2$.

FIG. 5 is a schematic diagram of digital signal processing circuitry 500 associated with the interleaved ADC system of FIG. 4. Digital processing circuitry includes the previously described ADC, skew estimator register 422 and the $ADC_2$ skew estimator register, microprocessor 502, and the previously described LDO1 control register 418, and the previously described LDO2 control register 420. Microprocessor receives the register data from skew estimator registers 422 and 424 and compares the relative skew data. If the skew data associated with $ADC_1$ skew estimator register 422 (skew of $ADC_1$) is greater than the skew data associated with $ADC_2$ skew estimator register 424 (skew of $ADC_2$), then the digital value of LDO1 control register 418 is increased (voltage of LDO1). If the skew data associated with $ADC_2$ skew estimator register 424 (skew of $ADC_2$) is greater than the skew data associated with $ADC_1$ skew estimator register 422 (skew of $ADC_1$), then the digital value of register 420 is increased (voltage of LDO2). In this manner, the relative skew between $ADC_1$ and $ADC_2$ can be balanced, thus minimizing errors in the digital output signal of the interleaved ADC.

"Skew" can be defined as either leading or lagging a reference sampling time. Leading and lagging skew in relationship to a reference sampling time, and adjustments in power supply voltages for balancing the relative skews in an interleaved ADC system is described below with references to FIGS. 6 and 7. "Skew" without the modifier "leading" or "lagging" is deemed to be a lagging skew that can be rebalanced by increasing the power supply of the corresponding ADC, in an embodiment. "Adjusting" a power supply voltage can thus comprise increasing or decreasing the power supply voltage as required to balance the relative skews of the ADCs in an interleaved ADC system.

Figure 6:
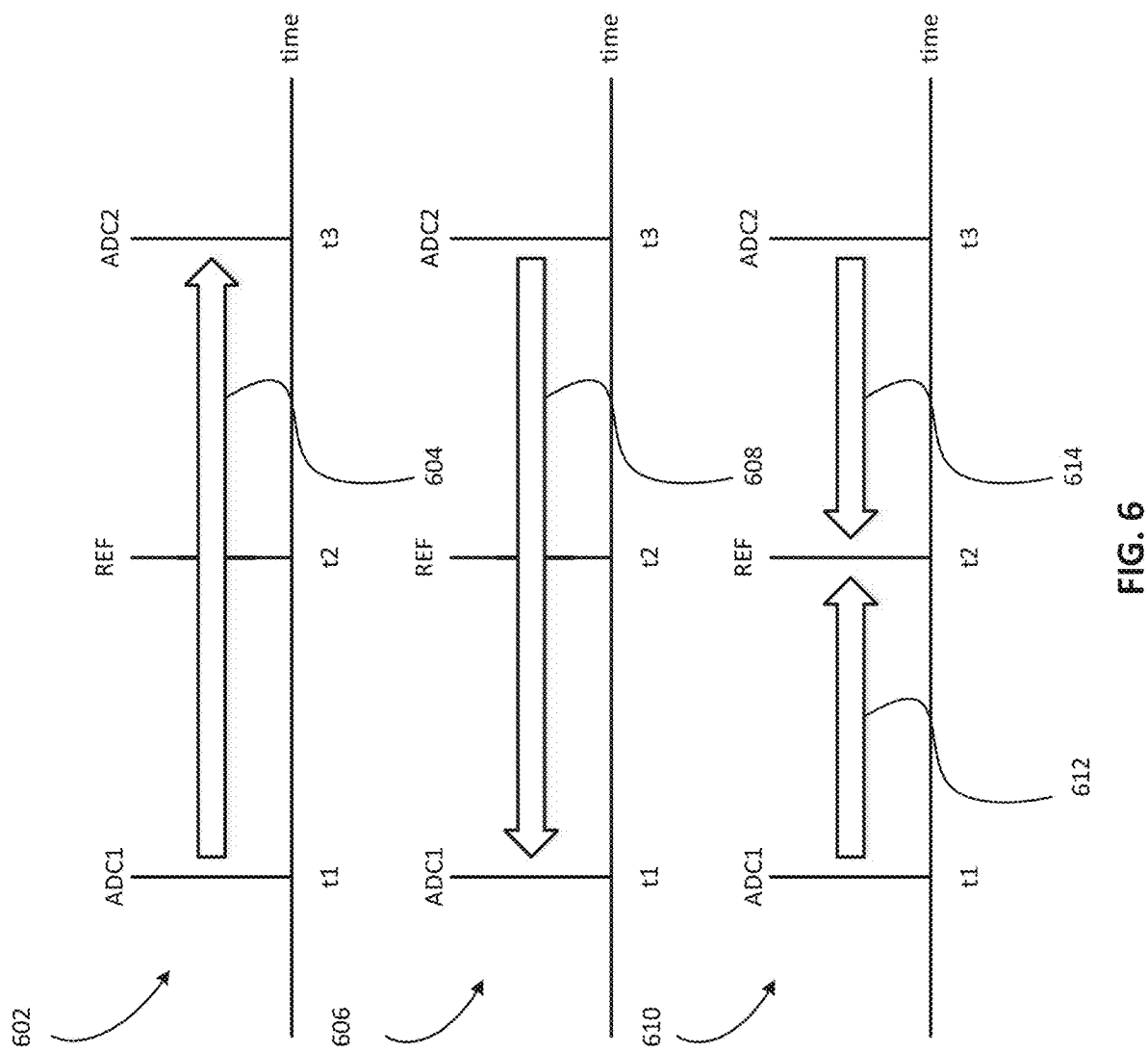
FIG. 6 is a timing diagram associated with the interleaved ADC system of FIG. 4 according to an embodiment.

FIG. 6 shows a timing diagram of an interleaved ADC system of FIG. 4 including two ADCs. Timing diagram 602 shows a first converter $ADC_1$ having a leading sampling time at time $t_1$, a reference sampling time at time $t_2$, and a second converter $ADC_2$ having a lagging sampling time at time $t_3$. To rebalance the skews for the interleaved ADC system, the power supply of $ADC_1$ is adjusted to make the sampling time of ADC, coincide with the sampling time of $ADC_2$. A power supply decrease 604 is made to $ADC_1$ such that its sampling time now occurs at time $t_3$. Note that in timing diagram 602, the skew performance is improved, but that the sampling times of converters $ADC_1$ and $ADC_2$ are not necessarily coincident with the designed sampling time $t_2$. Timing diagram shows 606 shows the two same converter sampling times, but with a different technique for adjusting the power supply voltages. Conversely, to rebalance the skews for the interleaved ADC system, the power supply of $ADC_2$ is adjusted to make the sampling time of $ADC_2$ coincide with the sampling time of $ADC_1$. A power supply increase 608 is made to $ADC_2$ such that its sampling time now occurs at time $t_1$. Note also that in timing diagram 606, the skew performance is improved, but that the sampling times of converters $ADC_1$ and $ADC_2$ are not necessarily coincident with the designed sampling time $t_2$. Finally, timing diagram 610 shows the two same converter sampling times, but with another different technique for adjusting the power supply voltages. To rebalance the skews for the interleaved ADC system, the power supplies of ADC, and $ADC_2$ are both adjusted to make the sampling times of ADC, and $ADC_2$ coincide with the reference sampling time of $t_2$. A power supply decrease 612 is made to $ADC_1$ such that its sampling time now occurs at time $t_2$, and a power supply increase 614 is made to $ADC_2$ such that its sampling time now also occurs at time $t_2$. Note also that in timing diagram 610, the skew performance is improved, and the sampling times of converters $ADC_1$ and $ADC_2$ are both coincident with the designed sampling time $t_2$.

Figure 7:
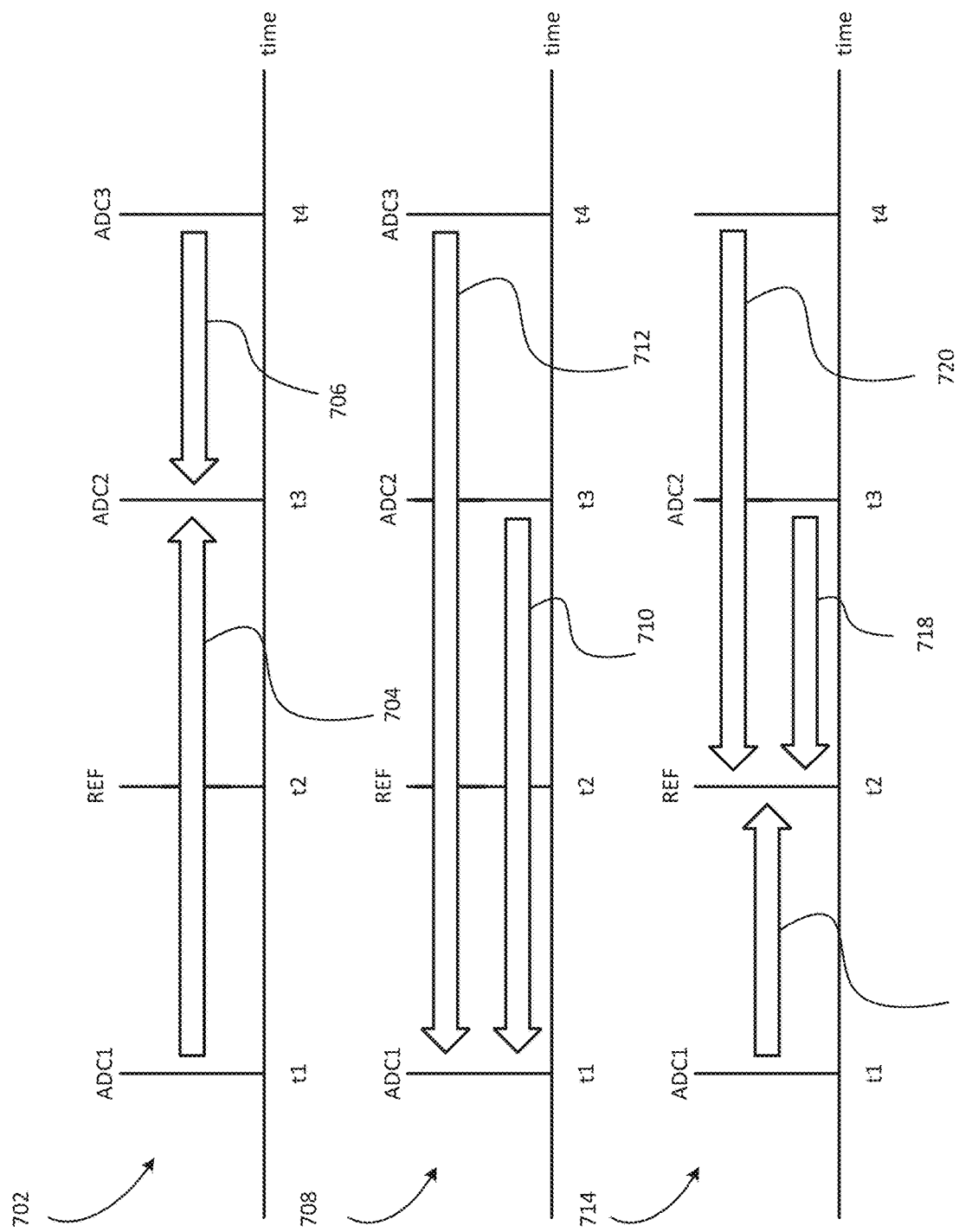
FIG. 7 is a timing diagram associated with the interleaved ADC system of FIG. 4 according to another embodiment.

FIG. 7 shows a timing diagram of an interleaved ADC system of FIG. 4 including three ADCs. Timing diagram 702 shows a first converter $ADC_1$ having a leading sampling time at time $t_1$, a reference sampling time at time $t_2$, a second converter $ADC_2$ having a lagging sampling time at time $t_3$, and a third converter $ADC_3$ having a lagging sampling time at $t_4$. To rebalance the skews for the interleaved ADC system, the power supply of ADC, is adjusted to make the sampling time of $ADC_1$ coincide with the sampling time of $ADC_2$. A power supply decrease 704 is made to $ADC_1$ such that its sampling time now occurs at time $t_3$. A power supply increase 706 is also made to $ADC_3$ such that its sampling time now also occurs at time $t_3$. Note that in timing diagram 702, the skew performance is improved, but that the sampling times of converters $ADC_1$, $ADC_2$, and $ADC_3$ are not necessarily coincident with the designed sampling time $t_2$. Timing diagram shows 708 shows the three same converter sampling times, but with a different technique for adjusting the power supply voltages. To rebalance the skews for the interleaved ADC system, the power supply of $ADC_2$ is adjusted to make the sampling time of $ADC_2$ coincide with the sampling time of $ADC_1$. A power supply increase 710 is made to $ADC_2$ such that its sampling time now occurs at time $t_1$. A power supply increase 712 is also made to $ADC_3$ such that its sampling time now also occurs at time $t_1$. Note also that in timing diagram 708, the skew performance is improved, but that the sampling times of converters $ADC_1$, $ADC_2$, and $ADC_3$ are not necessarily coincident with the designed sampling time $t_2$. Finally, timing diagram 714 shows the three same converter sampling times, but with another different technique for adjusting the power supply voltages. To rebalance the skews for the interleaved ADC system, the power supplies of $ADC_1$, $ADC_2$, and $ADC_3$ are all adjusted to make the sampling times of ADC, and $ADC_2$, $ADC_3$ coincide with the reference sampling time of $t_2$. A power supply decrease 716 is made to $ADC_1$ such that its sampling time now occurs at time $t_2$, a power supply increase 718 is made to $ADC_2$ such that its sampling time now also occurs at time $t_2$, and a power supply increase 720 is made to $ADC_3$ such that its sampling time now also occurs at time $t_2$. Note also that in timing diagram 714, the skew performance is improved, and the sampling times of converters $ADC_1$, $ADC_2$, and $ADC_3$ are all coincident with the designed sampling time $t_2$.

The timing diagrams of FIGS. 6 and 7 can be expanded to include any number of ADCs and/or sub-ADCS and any corresponding number of sampling times. For example, with respect to the ADC system of FIG. 4, if all 32 sub-ADCs are used (16 sub-ADCs per converter $ADC_1$ and $ADC_2$) there will be 32 separate sampling times that result in 32 separate skew estimations that can be balanced with 32 separate power supply adjustments.

FIG. 8 is a flow chart of an embodiment method 800 for an interleaved ADC system including two interleaved ADCs. The method begins at step 802 wherein the skew of $ADC_1$ is estimated. After estimating the skew of $ADC_1$, the skew of $ADC_2$ is estimated at step 804. If, at step 806, the skew of $ADC_1$ is greater than the skew of $ADC_2$, then the power supply voltage of ADC, is increased at step 808. If, at step 810, the skew of $ADC_2$ is greater than the skew of $ADC_1$, then the power supply voltage $ADC_2$ is increased at step 812. In this manner the skew between converters $ADC_1$ and $ADC_2$ can be more equalized as the increased power will increase the operating speed and decrease the skew of the corresponding ADC. The method 800 can be performed only once during an initialization or calibration mode of operation. However, the method 800 can be performed again if, for example, a change in environmental conditions is detected. Thus, at step 814 the state of the environmental operating condition is monitored. If there are no changes in the environmental operating condition, then the end of the skew calibration is attained at step 816. If there is a change in the environmental operating condition, then method 800 can be repeated by returning to step 802.

FIG. 9 is a flow chart of an embodiment method 900 for an interleaved ADC system including a plurality of interleaved ADCs. The method begins at step 902 wherein the skew of each ADC in the interleaved ADC system is estimated. After estimating the relative skews of the ADCs in the interleaved ADC system, all of the ADCs with skews different then a reference skew are determined at step 904. At step 906, the power supplies for each of the selected ADCs are adjusted. For example, the ADCs with greater skew will have their power supplies increased and the ADCs with less skew will have their power supplies decreased. All of the power supply voltages are appropriately adjusted at step 908 and the relative skews are balanced. The method 900 can be performed only once during an initialization or calibration mode of operation. However, the method 900 can be performed again if, for example, a change in environmental conditions is detected. Thus, at step 910 the state of the environmental operating condition is monitored. If there are no changes in the environmental operating condition, then the end of the skew calibration is attained at step 912. If there is a change in the environmental operating condition, then method 900 can be repeated by returning to step 902.

Figure 10A:
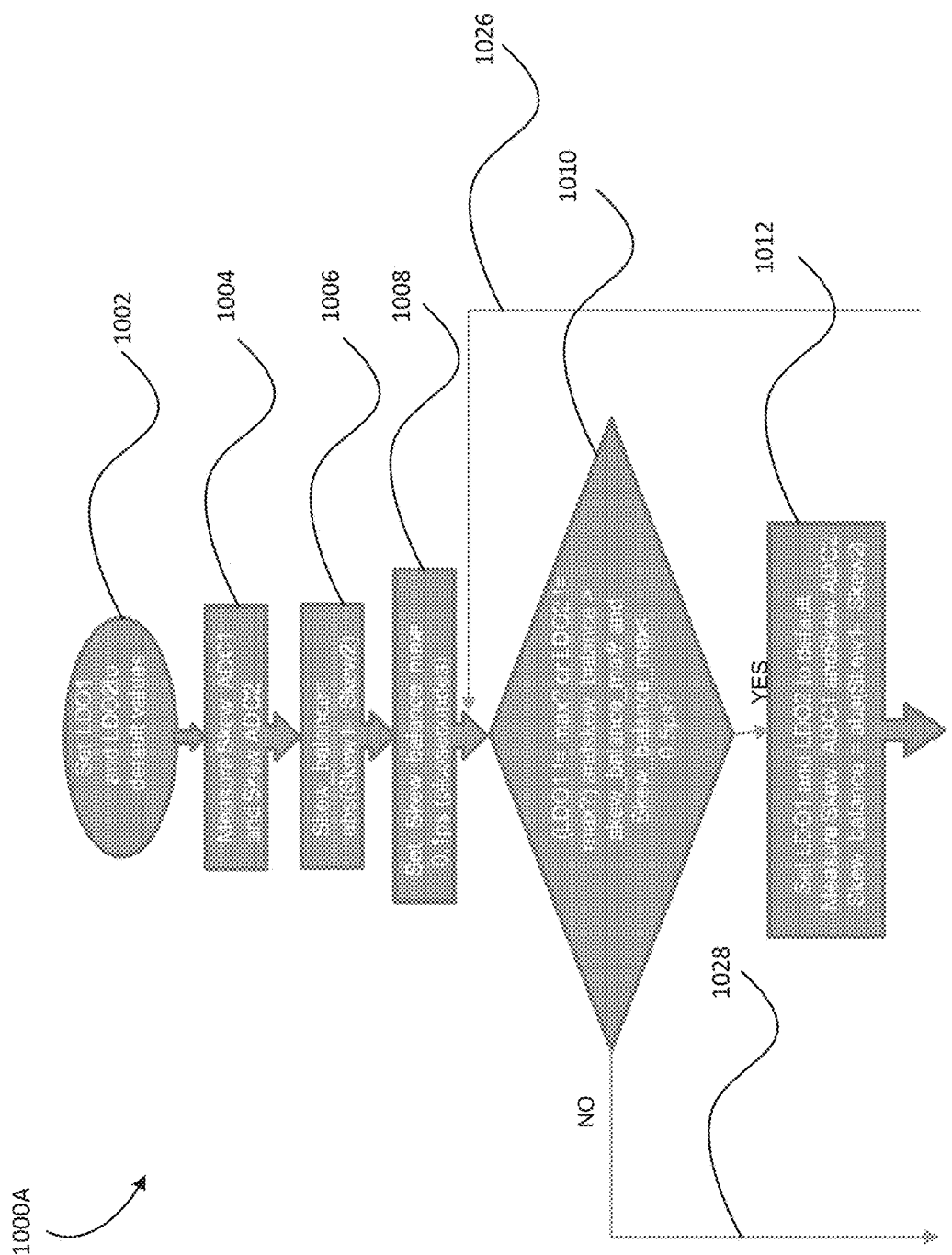
FIGS. 10A and 10B taken together comprise a more detailed flow chart for an embodiment interleaved ADC system than the flow chart illustrated in FIG. 8.
Figure 10B:
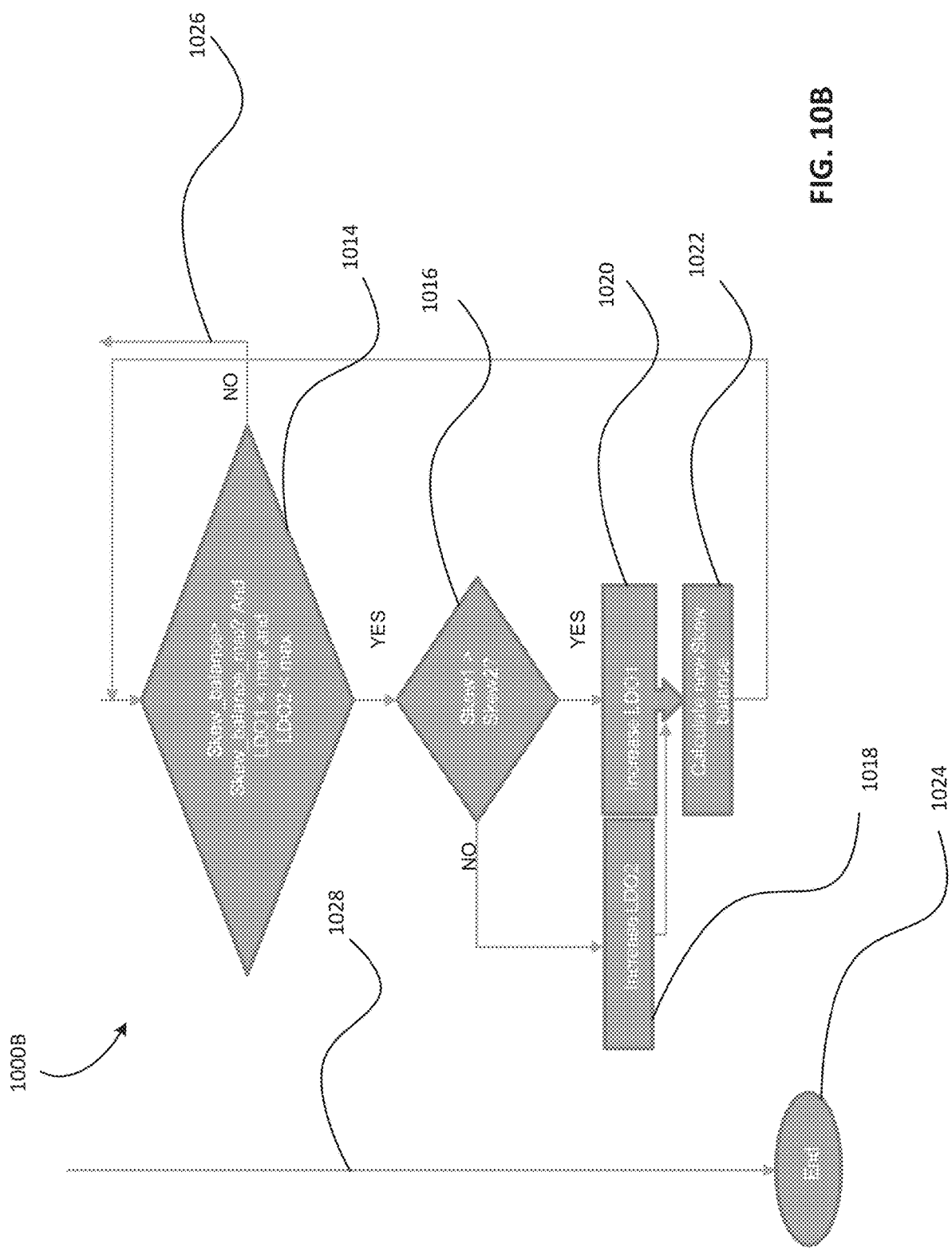

FIGS. 10A and 10B taken together comprise a more detailed flow chart for an embodiment method for operating an interleaved ADC system than the flow chart illustrated in FIG. 8. While FIGS. 10A and 10B are specifically directed to a two ADC system, the embodiment concepts illustrated in FIGS. 10A and 10B can be expanded to include an ADC system including more than two ADCs.

FIG. 10A shows a first portion 1000A of a detailed flow chart for an interleaved two ADC system. At step 1002 the LDO1 and LDO2 registers are set to default values. At step 1004 the skew of $ADC_1$ ($Skew_1$) and the skew of $ADC_2$ ($Skew_2$) are measured. At step 1006 the "skew balance" is calculated, which is defined as the absolute value of the difference between $Skew_1$ and $Skew_2$ ($abs(Skew_1-Skew_2)$). At step 1008 a maximum skew balance of 0.1 picoseconds is set. At step 1010, it is determined whether or not the value of LDO1 is not equal to the maximum value of LDO1 or LDO2 is not equal to the maximum value of LDO2, and whether or not the skew balance is greater than the maximum skew balance and the skew balance is less than 0.5 picoseconds. If no, the method continues of path 1028 to FIG. 10B. If yes, the method continues to step 1012. At step 1012 LDO1 and LDO are again set to default values, the skew of $ADC_1$ and $ADC_2$ are again measured. The skew balance is again calculated as being the absolute value of the difference between $Skew_1$ and $Skew_2$. The method continues in the second portion 100B of the detailed flow chart shown in FIG. 10B. FIG. 10A also shows the return path 1026 from FIG. 10B.

Thus, FIG. 10B shows a second portion 1000B of the detailed flow chart for an interleaved two ADC system. At step 1026 it is determined whether or not the skew balance is greater than the maximum skew balance and whether or not LDO1 is less than a maximum value and whether or not LDO2 is less than a maximum value. If now, the method returns to first portion 1000A in FIG. 10A along path 1026. If yes, then the method continues to step 1016. At step 1016, if $Skew_1$ is greater than $Skew_2$, than LDO1 is increased at step 1020. If $Skew_1$ is not greater than $Skew 2$, than LDO2 is increased at step 1018. After either steps 1018 or 1020, the method continues to step 1022 to calculate a new skew balance value and the method continues at step 1014. Path 1028 from FIG. 10A is also shown as ending the method at step 1024.

While embodiment methods have been shown in the flow charts of FIGS. 8, 9, 10A, and 10B, it will be appreciated by those skilled in the art than many other such flow charts could be constructed for adjusting the power supplies (increasing or decreasing the power supply value or incrementing or decrementing the control register) of at least one ADC or sub-ADC in an interleaved ADC system in order to balance the skews thereof, and to provide a more accurate composite digital output signal corresponding to an analog input signal.

Example embodiments of the present invention are summarized here. Other embodiments can also be understood from the entirety of the specification and the claims filed herein.

Example 1

According to an embodiment, an interleaved analog to digital converter ("ADC") system comprises a first ADC having an input configured for sampling an analog signal during a first time period, an output configured for providing a digital signal representative of the analog signal during the first time period, and a power supply terminal configured for receiving a first power supply voltage; a second ADC having an input configured for sampling the analog signal during a second time period different than the first time period, an output configured for providing a digital signal representative of the analog signal during the second time period, and a power supply terminal configured for receiving a second power supply voltage; a first skew estimator configured for estimating a skew value of the first ADC; a second skew estimator configured for estimating a skew value of the second ADC; and a comparator circuit configured for comparing the skew value of the first ADC to the skew value of the second ADC, adjusting the first power supply voltage in response to a first output value of the comparator circuit, and adjusting the second power supply voltage in response to a second output value of the comparator circuit.

Example 2

The ADC system of Example 1, wherein the first skew estimator comprises a first skew estimator register associated with the first ADC, and wherein the second skew estimator comprises a second skew estimator register associated with the second ADC.

Example 3

The ADC system of any of the previous examples, further comprising a first voltage regulator configured for providing the first power supply voltage to the first ADC; and a second voltage regulator configured for providing the second power supply voltage to the second ADC.

Example 4

The ADC system of any of the previous examples, wherein the first voltage regulator comprises a low dropout (LDO) voltage regulator including an LDO control register, and wherein the second voltage regulator comprises a low dropout (LDO) voltage regulator including an LDO control register.

Example 5

The ADC system of any of the previous examples, wherein the comparator circuit comprises a digital processor.

Example 6

The ADC system of any of the previous examples, wherein the comparator circuit is configured to adjust at least one of the first power supply voltage or the second power supply voltage during an initial mode of operation of the ADC system.

Example 7

The ADC system of any of the previous examples, wherein the comparator circuit is configured to readjust at least one of the first power supply voltage or the second power supply voltage after a change in environmental conditions of the ADC system is detected.

Example 8

According to an embodiment, an interleaved analog to digital converter ("ADC") system comprises a plurality of ADCs having an input configured for sampling an analog signal during a dedicated time period, an output configured for providing a digital signal representative of the analog signal during the dedicated time period, and a power supply terminal configured for receiving a power supply voltage; a plurality of skew estimators configured for estimating a skew value of each of the plurality of ADCs; and a comparator circuit configured for comparing at least two of the skew values of the plurality of ADCs and adjusting the power supply voltage of at least one of the ADCs in response to an output signal of the comparator circuit.

Example 9

The ADC system of Example 8, wherein each of the plurality of skew estimators comprises a skew estimator register associated with a corresponding one of the plurality of ADCs.

Example 10

The ADC system of any of the previous examples, further comprising a plurality of voltage regulators configured for providing the power supply voltage to the plurality of ADCs.

Example 11

The ADC system of any of the previous examples, wherein each of the plurality of voltage regulators comprises a low dropout (LDO) voltage regulator including an LDO control register.

Example 12

The ADC system of any of the previous examples, wherein the comparator circuit comprises a digital processor.

Example 13

The ADC system of any of the previous examples, wherein the comparator circuit is configured to adjust at least one of the power supply voltages during an initial mode of operation of the ADC system.

Example 14

The ADC system of any of the previous examples, wherein the comparator circuit is configured to readjust at least one of the power supply voltages after a change in environmental conditions of the ADC system is detected.

Example 15

According to an embodiment, a method of operating an interleaved analog to digital converter ("ADC") system, the method comprises estimating a skew value of a first ADC in the ADC system, wherein the first ADC converts an analog input signal to a digital output signal during a first time period; estimating a skew value of a second ADC in the ADC system, wherein the second ADC converts the analog input signal to a digital output signal during a second time period different than the first time period; comparing the skew values of the first ADC and the second ADC; generating a comparison signal after comparing the skew values; adjusting a power supply voltage of the first ADC in response to a first value of the comparison signal; and adjusting a power supply voltage of the second ADC in response to a second value of the comparison signal.

Example 16

The method of Example 15, wherein estimating a skew value of a first ADC in the ADC system comprises generating a first skew estimator register value, and wherein estimating a skew value of a second ADC in the ADC system comprises generating a second skew estimator register value.

Example 17

The method of any of the previous examples, further comprising providing the first power supply voltage to the first ADC with a first voltage regulator; and providing the second power supply voltage to the second ADC with a second voltage regulator.

Example 18

The method of any of the previous examples, wherein adjusting the power supply voltage of the first ADC in response to a first value of the comparison signal comprises adjusting a register of the first voltage regulator, and wherein adjusting the power supply voltage of the second ADC in response to a second value of the comparison signal comprises adjusting a register of the second voltage regulator.

Example 19

The method of any of the previous examples, wherein comparing the skew values of the first ADC and the second ADC and generating a comparison signal after comparing the skew values is performed by a digital processor.

Example 20

The method of any of the previous examples, wherein adjusting the power supply voltage of the first ADC in response to a first value of the comparison signal or adjusting the power supply voltage of the second ADC in response to a second value of the comparison signal is performed once during an initial mode of operation of the ADC system.

While embodiments have been illustrated and described with respect to adjusting the power supplies of individual ADCs in an interleaved ADC system in response to estimating the skew of the individual ADCs, it will be understood by those skilled in the art that the power supplies of all or at least some of the individual sub-ADCs can also be adjusted in a manner similar to that described herein, especially in embodiments having access to individual sub-ADC skew estimator registers.

Simulations have shown that embodiment concepts have provided substantially increased performance in the composite digital output signal with respect to interleaved ADC systems not including the embodiment concepts with respect to the following specifications: SFDR (Spurious Free Dynamic Range), SNR (Signal-to-Noise Ratio), and ENOB (Effective Number Of Bits).

It is an advantage of embodiments described herein that they save power expended performing digital calibration. It is a further advantage that the embodiments described herein do not interact with sensitive internal nodes of analog circuitry that could cause other system problems. Finally, it is an advantage that the embodiments described herein can be used instead of or in combination with previous skew rebalancing and correction solutions as desired.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An interleaved analog to digital converter ("ADC") system comprising:
   a first ADC having an input configured for sampling an analog signal during a first time period, an output configured for providing a digital signal representative of the analog signal during the first time period, and a power supply terminal configured for receiving a first power supply voltage;
   a second ADC having an input configured for sampling the analog signal during a second time period different than the first time period, an output configured for providing a digital signal representative of the analog signal during the second time period, and a power supply terminal configured for receiving a second power supply voltage;
   a first skew estimator configured for estimating a skew value of the first ADC;
   a second skew estimator configured for estimating a skew value of the second ADC; and
   a comparator circuit configured for comparing the skew value of the first ADC to the skew value of the second ADC, adjusting the first power supply voltage in response to a first output value of the comparator circuit, and adjusting the second power supply voltage in response to a second output value of the comparator circuit.

2. The ADC system of claim 1, wherein the first skew estimator comprises a first skew estimator register associated with the first ADC, and wherein the second skew estimator comprises a second skew estimator register associated with the second ADC.

3. The ADC system of claim 1, further comprising:
   a first voltage regulator configured for providing the first power supply voltage to the first ADC; and
   a second voltage regulator configured for providing the second power supply voltage to the second ADC.

4. The ADC system of claim 3, wherein the first voltage regulator comprises a low dropout (LDO) voltage regulator including an LDO control register, and wherein the second voltage regulator comprises a low dropout (LDO) voltage regulator including an LDO control register.

5. The ADC system of claim 1, wherein the comparator circuit comprises a digital processor.

6. The ADC system of claim 1, wherein the comparator circuit is configured to adjust at least one of the first power supply voltage or the second power supply voltage during an initial mode of operation of the ADC system.

7. The ADC system of claim 6, wherein the comparator circuit is configured to readjust at least one of the first power supply voltage or the second power supply voltage after a change in environmental conditions of the ADC system is detected.

8. An interleaved analog to digital converter ("ADC") system comprising:
   a plurality of ADCs having an input configured for sampling an analog signal during a dedicated time period, an output configured for providing a digital signal representative of the analog signal during the dedicated time period, and a power supply terminal configured for receiving a power supply voltage;
   a plurality of skew estimators configured for estimating a skew value of each of the plurality of ADCs; and
   a comparator circuit configured for comparing at least two of the skew values of the plurality of ADCs and adjusting the power supply voltage of at least one of the ADCs in response to an output signal of the comparator circuit.

9. The ADC system of claim 8, wherein each of the plurality of skew estimators comprises a skew estimator register associated with a corresponding one of the plurality of ADCs.

10. The ADC system of claim 8, further comprising a plurality of voltage regulators configured for providing the power supply voltage to the plurality of ADCs.

11. The ADC system of claim 10, wherein each of the plurality of voltage regulators comprises a low dropout (LDO) voltage regulator including an LDO control register.

12. The ADC system of claim 8, wherein the comparator circuit comprises a digital processor.

13. The ADC system of claim 8, wherein the comparator circuit is configured to adjust at least one of the power supply voltages during an initial mode of operation of the ADC system.

14. The ADC system of claim 13, wherein the comparator circuit is configured to readjust at least one of the power supply voltages after a change in environmental conditions of the ADC system is detected.

15. A method of operating an interleaved analog to digital converter ("ADC") system, the method comprising:
   estimating a skew value of a first ADC in the ADC system, wherein the first ADC converts an analog input signal to a digital output signal during a first time period;
   estimating a skew value of a second ADC in the ADC system, wherein the second ADC converts the analog input signal to a digital output signal during a second time period different than the first time period;
   comparing the skew values of the first ADC and the second ADC;

generating a comparison signal after comparing the skew values;

adjusting a power supply voltage of the first ADC in response to a first value of the comparison signal; and adjusting a power supply voltage of the second ADC in response to a second value of the comparison signal.

16. The method of claim 15, wherein estimating a skew value of a first ADC in the ADC system comprises generating a first skew estimator register value, and wherein estimating a skew value of a second ADC in the ADC system comprises generating a second skew estimator register value.

17. The method of claim 15, further comprising:

providing the first power supply voltage to the first ADC with a first voltage regulator; and providing the second power supply voltage to the second ADC with a second voltage regulator.

18. The method of claim 17, wherein adjusting the power supply voltage of the first ADC in response to a first value of the comparison signal comprises adjusting a register of the first voltage regulator, and wherein adjusting the power supply voltage of the second ADC in response to a second value of the comparison signal comprises adjusting a register of the second voltage regulator.

19. The method of claim 15, wherein comparing the skew values of the first ADC and the second ADC and generating a comparison signal after comparing the skew values is performed by a digital processor.

20. The method of claim 15, wherein adjusting the power supply voltage of the first ADC in response to a first value of the comparison signal or adjusting the power supply voltage of the second ADC in response to a second value of the comparison signal is performed once during an initial mode of operation of the ADC system.

* * * * *